(12) United States Patent
Kang et al.

(10) Patent No.: US 10,491,208 B2
(45) Date of Patent: Nov. 26, 2019

(54) SEMICONDUCTOR DEVICE INCLUDING CMOS CIRCUIT AND OPERATION METHOD THEREOF

(71) Applicant: ELECTRONICS AND TELECOMMUNICATIONS RESEARCH INSTITUTE, Daejeon (KR)

(72) Inventors: Tae Wook Kang, Daejeon (KR); Jae-Jin Lee, Daejeon (KR); Kwang Il Oh, Daejeon (KR); Sung Eun Kim, Daejeon (KR); Sukho Lee, Daejeon (KR); Kyuseung Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/262,738

(22) Filed: Jan. 30, 2019

(65) Prior Publication Data

US 2019/0245532 A1 Aug. 8, 2019

(30) Foreign Application Priority Data

Feb. 5, 2018 (KR) .................. 10-2018-0014246
May 23, 2018 (KR) .................. 10-2018-0058440

(51) Int. Cl.
*G01R 31/26* (2014.01)
*H03K 17/14* (2006.01)
*H03K 17/08* (2006.01)

(52) U.S. Cl.
CPC .......... *H03K 17/145* (2013.01); *H03K 17/08* (2013.01); *H03K 2017/0806* (2013.01); *H03K 2217/0027* (2013.01)

(58) Field of Classification Search
CPC .................. H03K 17/145; H03K 17/08; H03K 2017/0806; H03K 2217/0027
See application file for complete search history.

(56) References Cited

U.S. PATENT DOCUMENTS 7,274,247 B2 * 9/2007 Ward .................. H03K 19/0016
327/534
7,616,048 B2 11/2009 Choi et al.
(Continued)

FOREIGN PATENT DOCUMENTS

| KR | 20080021991 A | 3/2008 |
| KR | 20140074668 A | 6/2014 |
| KR | 20160020853 A | 2/2016 |

*Primary Examiner* — Dinh T Le

(57) ABSTRACT

The inventive concept relates to a semiconductor device including a CMOS circuit and an operation method thereof. A semiconductor device according to an embodiment of the inventive concept includes a semiconductor circuit, a controller, and a voltage generator. The semiconductor circuit operates at a drive voltage to reduce the delay time between input and output as the temperature increases. The controller determines the malfunction of the CMOS circuit based on the difference between the source-drain current of the PMOS transistor and the source-drain current of the NMOS transistor as the temperature changes. The voltage generator generates or adjusts a body-bias voltage applied to the PMOS transistor or the NMOS transistor based on a malfunction determination of the controller. According to the inventive concept, malfunctions and performance deterioration occurring in a CMOS circuit operating at a low voltage may be reduced.

16 Claims, 10 Drawing Sheets

(56) References Cited

U.S. PATENT DOCUMENTS

| | | |
|---|---|---|
| 7,759,960 B2 * | 7/2010 | Gattiker ............ G01R 31/2856 |
| | | 324/750.05 |
| 8,791,685 B2 | 7/2014 | Cho et al. |
| 8,988,135 B2 | 3/2015 | Kim et al. |
| 9,467,135 B2 | 10/2016 | Kim et al. |
| 9,559,665 B2 | 1/2017 | Chhabra |
| 9,571,104 B1 | 2/2017 | Menezes |
| 2012/0154028 A1 | 6/2012 | Kim et al. |

* cited by examiner

SEMICONDUCTOR DEVICE INCLUDING CMOS CIRCUIT AND OPERATION METHOD THEREOF

CROSS-REFERENCE TO RELATED APPLICATIONS

This U.S. non-provisional patent application claims priority under 35 U.S.C. § 119 of Korean Patent Application Nos. 10-2018-0014246, filed on Feb. 5, 2018, and 10-2018-0058440, filed on May 23, 2018, the entire contents of which are hereby incorporated by reference.

BACKGROUND

The present disclosure herein relates to control of a semiconductor device operating at a low voltage, and more particularly to a semiconductor device including a CMOS circuit and an operation method thereof.

Semiconductor devices are widely used in a variety of electronic devices based on characteristics such as miniaturization, integration, and versatility. The semiconductor device may include a complementary metal-oxide semiconductor (CMOS) circuit advantageous for high-speed operation and low-power driving. The CMOS circuit includes a p-channel MOS (PMOS) transistor and an n-channel MOS (NMOS) transistor that operate complementarily with each other. CMOS circuits may be used to implement various logic circuits such as inverters, flip-flops, NOR, NAND, XNOR gate circuits, and the like.

Modern societies provide a variety of electronic devices, such as devices for the Internet of Things (IoT), portable electronic devices, wearable devices, and the like. Even if any aspects such as increase in electronic devices, long drive, portability, low cost and high efficiency drive are taken into consideration, low-power drive technology for electronic devices is always a key requirement.

Recently, in a semiconductor device including a CMOS circuit, a circuit operation technique using a low voltage such as a near-threshold voltage (NTV) or a sub-threshold voltage (STV) is attracting attention. However, in the process of operating the semiconductor circuit at a low voltage, a malfunction or deterioration in performance may occur, which is not caused by an operation based on a conventional super-threshold voltage. Accordingly, there is a demand for preventing malfunction or performance deterioration of a semiconductor device operating at a low voltage.

SUMMARY

The present disclosure is to provide a semiconductor device capable of reducing malfunction and performance deterioration occurring in a CMOS circuit operating at a low voltage according to a change in temperature, and an operation method thereof.

An embodiment of the inventive concept provides a semiconductor device including: a semiconductor circuit including a CMOS circuit including a PMOS transistor and an NMOS transistor, and configured to operate with a drive voltage to reduce a delay time between input and output as a temperature increases; a controller configured to determine a malfunction of the CMOS circuit based on a first difference between a first source-drain current of the PMOS transistor and a second source-drain current of the NMOS transistor according to a change in temperature; and a voltage generator configured to generate or adjust a body-bias voltage applied to the PMOS transistor or the NMOS transistor based on the determination of the controller.

In an embodiment, the controller may determine the malfunction by referring to a characteristic table and a malfunction reference table, wherein the characteristic table may include information on a magnitude of the first source-drain current and a magnitude of the second source-drain current according to a change in operating conditions of the semiconductor circuit, wherein the malfunction reference table may include information on a threshold value of the first difference to determine the malfunction.

In an embodiment, the controller may refer to the malfunction reference table to determine whether the first difference is greater than the threshold value, and if the first difference is greater than the threshold value, refer to the characteristic table to provide a body-bias control signal to the voltage generator.

In an embodiment, the operating conditions may include a temperature of the semiconductor circuit, a drive voltage of the semiconductor circuit, a magnitude of a clock signal applied to the CMOS circuit, or a channel width of the PMOS transistor or the NMOS transistor.

In an embodiment, as the temperature increases, if the first difference is greater than the threshold value, the voltage generator may increase a body-bias voltage applied to the NMOS transistor.

In an embodiment, as the temperature increases, if the first difference is greater than the threshold value, the voltage generator may increase a body-bias voltage applied to the PMOS transistor.

In an embodiment, the semiconductor circuit may further include a spare circuit including a MOS transistor having a channel width different from that of the PMOS transistor or the NMOS transistor, wherein the controller may further determine a malfunction of the CMOS circuit to which the body-bias voltage is applied, and replace the PMOS transistor or the NMOS transistor with the spare circuit when it is determined that the CMOS circuit is malfunctioned.

In an embodiment, the controller may compare a threshold value with a second difference between a third source-drain current of the PMOS transistor and a fourth source-drain current of the NMOS transistor as the body-bias voltage is applied, and if the second difference is greater than the threshold value, replace the PMOS transistor or the NMOS transistor with the spare circuit.

In an embodiment, the semiconductor circuit may further include a spare circuit including a MOS transistor having a channel width different from that of the PMOS transistor or the NMOS transistor, wherein the controller may replace the PMOS transistor or the NMOS transistor with the spare circuit when the body-bias voltage is greater than a reference bias voltage.

In an embodiment of the inventive concept, an operation method of a semiconductor device including a CMOS circuit includes: applying a gate voltage to the CMOS circuit operating at a drive voltage to reduce a delay time between input and output as a temperature increases; measuring a difference between a first source-drain current flowing through a PMOS transistor of the CMOS circuit and a second source-drain current flowing through an NMOS transistor of the CMOS circuit according to a change in temperature; determining a malfunction of the CMOS circuit based on the difference; and applying a body-bias voltage to the PMOS transistor or the NMOS transistor when it is determined that the CMOS circuit is malfunctioned.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the inventive concept.

Figure 1:
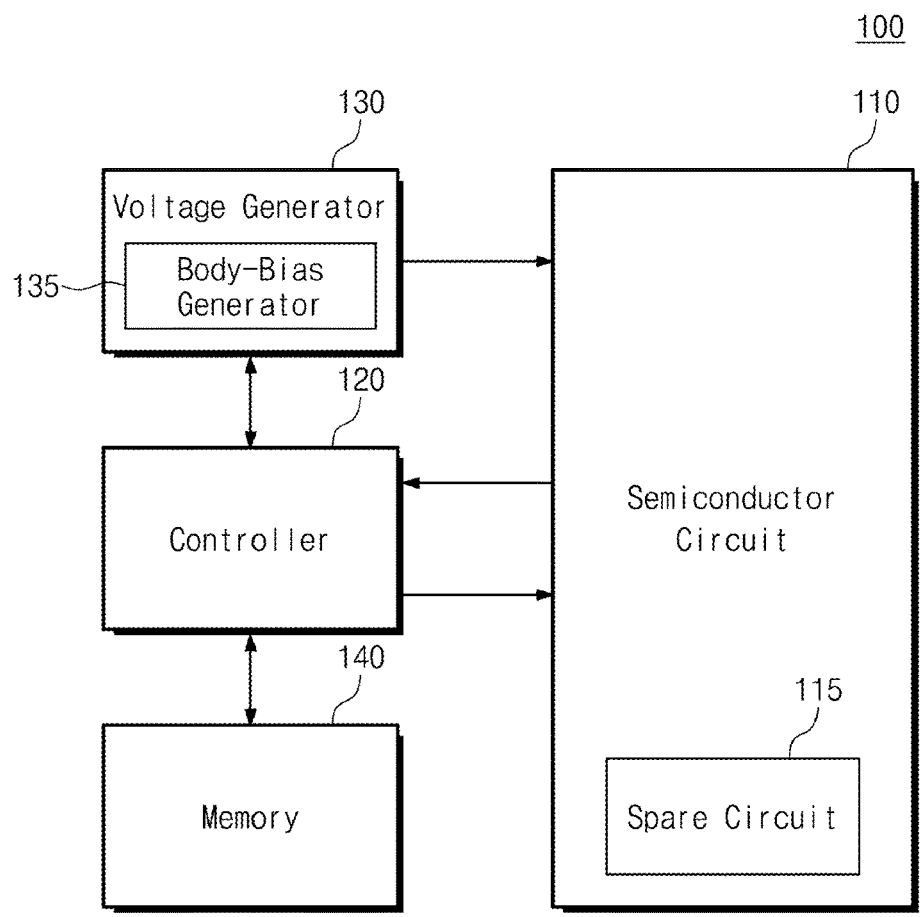
FIG. 1 is a block diagram of a semiconductor device according to an embodiment of the inventive concept.

FIG. 1 is a block diagram of a semiconductor device according to an embodiment of the inventive concept. Referring to FIG. 1, a semiconductor device 100 includes a semiconductor circuit 110, a controller 120, a voltage generator 130, and a memory 140. The semiconductor device 100 of FIG. 1 may be applied to various fields, and the object of application is not limited. For example, the semiconductor device 100 may be an electronic device that constitutes a part of an Internet of Things (IoT) system for managing indoor environments and the like.

The semiconductor circuit 110 may include a complementary metal-oxide semiconductor (CMOS) circuit. The semiconductor circuit 110 may include various logic circuits such as inverters, flip-flops, NOR, NAND, XNOR gate circuits, and the like, and the CMOS circuit may be used to implement such a logic circuit. The semiconductor circuit 110 may include various logic circuits, and the semiconductor circuit 110 or one logic circuit may include a plurality of CMOS circuits. The CMOS circuit includes a p-channel MOS (PMOS) transistor and an re-channel MOS (NMOS) transistor that operate complementarily with each other. The drain terminal of the PMOS transistor and the drain terminal of the NMOS transistor may be connected to each other, and based on the gate voltages applied to the gate terminals of the PMOS transistor and the NMOS transistor, a channel may be formed in each of the PMOS transistor and the NMOS transistor.

The semiconductor circuit 110 may be implemented to operate at a low voltage such as a near-threshold voltage (NTV) or a sub-threshold voltage (STV). For example, the low voltage may mean a driving voltage of about 1 V or less, and this driving voltage may be the VDD voltage provided at the source terminal of the PMOS transistor included in the CMOS circuit. The semiconductor circuit 110 operating at a low voltage may have a temperature-effect inversion (TEI) characteristic. TEI means a phenomenon in which the driving speed of the semiconductor circuit 110 increases with an increase in temperature, unlike a normal operation, when the semiconductor circuit 110 operates at a low voltage. This TEI will be described later in detail with reference to FIG. 2.

The semiconductor circuit 110 implemented to operate at a low voltage has an advantage that the power consumption is reduced and the speed reduction due to the heat generation of the semiconductor circuit 110 is prevented. However, a characteristic change that does not affect the performance of a general semiconductor circuit may occur in the semiconductor circuit 110. The characteristic change may not occur, or may weakly occur in the general semiconductor circuit. Specifically, when the temperature changes due to the operation state of the semiconductor circuit 110 or the influence of the environment, a characteristic difference may occur due to a structural difference between the PMOS transistor and the NMOS transistor. Especially, in a CMOS circuit operating at a low voltage, as the temperature increases, the difference between the source-drain current (hereinafter, PMOS source-drain current) flowing in the PMOS transistor and the source-drain current (hereinafter, NMOS source-drain current) flowing in the NMOS transistor may occur greatly compared to a general operation. These characteristic differences will be described later in detail with reference to FIGS. 3 to 8.

In order to compensate for the characteristic difference between the PMOS transistor and the NMOS transistor included in the semiconductor circuit 110, a body-bias voltage may be applied to the PMOS transistor or the NMOS transistor. It will be understood that the meaning of 'or' herein is a concept that may encompass any one of the two configurations (e.g., PMOS and NMOS transistors) as well as both configurations. For example, as the body-bias voltage applied to the NMOS transistor increases, the NMOS source-drain current may increase. If the increase amount in the PMOS source-drain current with temperature increase is greater than the increase amount in the NMOS source-drain current, the body-bias voltage applied to the NMOS transistor may increase.

The semiconductor circuit 110 may further include a spare circuit 115 in addition to the CMOS circuit described above. The spare circuit 115 may include a MOS transistor. The MOS transistor may be a PMOS transistor or an NMOS transistor. The MOS transistor included in the spare circuit 115 may have a channel width different from that of the PMOS transistor or the NMOS transistor included in the CMOS circuit. The characteristic difference between the PMOS transistor and the NMOS transistor caused by the change of the temperature may not be overcome by adjustment of the body-bias voltage, or may cause considerable power consumption due to the adjustment of the body-bias voltage. In this case, the PMOS transistor or the NMOS transistor may be replaced with the spare circuit 115 under the control of the controller 120. For example, the electrical connection between the PMOS transistor and the NMOS transistor is cut off, and the PMOS transistor or the NMOS transistor and the spare circuit 115 may be electrically connected.

The controller 120 determines a malfunction of the CMOS circuit included in the semiconductor circuit 110. When the semiconductor circuit 110 includes a plurality of CMOS circuits, the controller 120 may distinguish CMOS circuits with malfunction occurred among the plurality of CMOS circuits. The controller 120 may sense a difference in characteristics between the PMOS transistor and the NMOS transistor according to a change in temperature. For this, the controller 120 may receive PMOS source-drain current information and NMOS source-drain current information from the semiconductor circuit 110. Here, the source-drain current information may be an electrical signal generated by mirroring the source-drain current or by detecting a part of the source-drain current.

The controller 120 may determine the malfunction of the CMOS circuit based on the difference (hereinafter referred to as difference value) between the PMOS source-drain current and the NMOS source-drain current. To calculate the difference value, the controller 120 may illustratively include a differential amplifier circuit for differentially amplifying the PMOS source-drain current information and the NMOS source-drain current information. The controller 120 may determine whether the difference value is greater than (or equal to or greater than) the threshold value, and for this, the controller 120 may illustratively include a comparator. Here, the threshold value may be defined as the maximum value of the difference value in which it is determined that the CMOS circuit is operating normally. If the difference value is greater than (or equal to or greater than) the threshold value, the controller 120 may control the body-bias voltage applied to the PMOS transistor or the NMOS transistor so that the difference value is less than or equal to (or less than) the threshold value.

The controller 120 may determine a malfunction of the CMOS circuit by referring to the malfunction reference table. The malfunction reference table may include information on a threshold value at which deterioration or malfunction occurs depending on the type of the semiconductor circuit. Here, the type of the semiconductor circuit may refer to a kind of logic circuit designed in the semiconductor circuit 110, such as an inverter, a flip-flop, or a NOR, NAND, or XNOR gate circuit. For example, if the PMOS source-drain current is greater than the NMOS source-drain current, depending on the process of the circuit, the temperature of the semiconductor circuit 110, or the drive voltage (or gate voltage), the information on the threshold value may have a positive number, and if the PMOS source-drain current is less than the NMOS source-drain current, have a negative number.

The controller 120 may extract the threshold value for the logic circuit including the CMOS circuit by referring to the malfunction reference table. The controller 120 may compare the difference value with the extracted threshold value to determine malfunction of the CMOS circuit. However, the inventive concept is not limited to this, and the controller 120 may determine malfunction of the CMOS circuit without separately measuring or receiving the above-described difference value. For example, the controller 120 may determine a malfunction of the CMOS circuit using a threshold value of a malfunction reference table corresponding to various operating conditions such as the type of a logic circuit. The malfunction reference table may be written to the memory 140. However, the inventive concept is not limited to this, and the controller 120 may determine a malfunction of the CMOS circuit by referring to a malfunction reference table generated and recorded by a host (not shown) or a semiconductor design device (not shown).

The controller 120 may control the body-bias voltage applied to the PMOS transistor or the NMOS transistor by referring to the characteristic table. The characteristic table may include information on a PMOS source-drain current, an NMOS source-drain current, or a difference value thereof according to a change in an operating condition of the semiconductor circuit 110. Here, the operating condition, for example, may be at least one of temperature, a driving voltage of the CMOS circuit, a gate voltage applied to the CMOS circuit, body-bias voltages applied to the PMOS transistor and the NMOS transistor, and channel widths of the PMOS transistor and the NMOS transistor.

The controller 120 may extract the PMOS source-drain current, the NMOS source-drain current, or the difference value thereof according to the operating condition of the current semiconductor circuit 110 with reference to the characteristic table. In addition, the controller 120 may extract the body-bias voltage level at which the difference value is less than or equal (or less than) to the threshold value. The controller 120 may generate a body-bias control signal for controlling the voltage generator 130 based on the extracted body-bias voltage level. The characteristic table may be written to the memory 140. However, the inventive concept is not limited to this, and the controller 120 may control the body-bias voltage with reference to the characteristic table generated and recorded by a host (not shown) or a semiconductor design device (not shown).

The voltage generator 130 generates a voltage to be provided to the semiconductor circuit 110. The voltage generator 130 may generate a drive voltage for the low voltage operation of the semiconductor circuit 110. For example, the voltage generator 130 may generate and supply a drive voltage of an ultra-low voltage (ULV) level of about 1 V or less to the semiconductor circuit 110.

The voltage generator 130 includes a body-bias generator 135. The body-bias generator 135 may generate a voltage applied to the body of the PMOS transistor or the body of the NMOS transistor. The body-bias generator 135 may generate or adjust the body-bias voltage applied to the PMOS transistor or the NMOS transistor according to the malfunction determination of the controller 120. For this, the body-bias generator 135 may receive the body-bias control signal generated based on the malfunction determination of the controller 120.

The memory 140 may be configured to store various operation information or result information generated during the management and control operations of the controller 120. For example, the memory 140 may be configured to store information on the drive voltage level for operating the semiconductor circuit 110, information on a clock signal input to the semiconductor circuit 110, information on the output result of the semiconductor circuit 110, information on a malfunction determination result of the controller 120, information on the body-bias voltage level, a malfunction reference table and a characteristic table, and the like. The memory 140 may include a non-volatile memory device or a volatile memory device.

Figure 2:
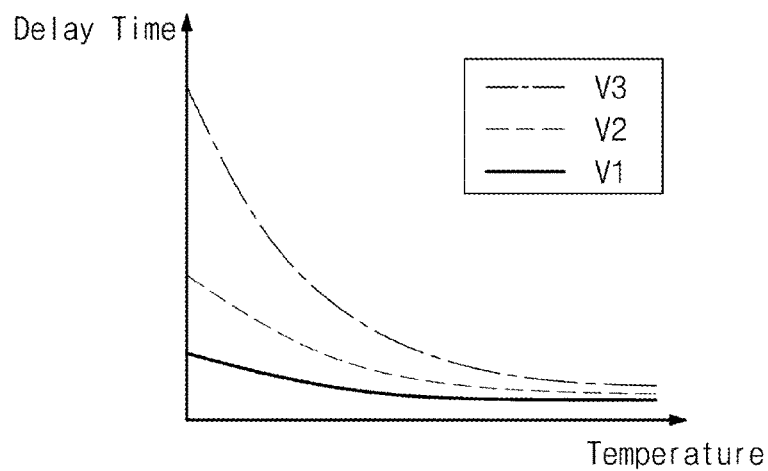
FIG. 2 is a graph for explaining the temperature-effect inversion effect of the semiconductor circuit of FIG. 1.

FIG. 2 is a graph for explaining the TEI of the semiconductor circuit of FIG. 1. Referring to FIG. 2, the horizontal axis represents a temperature, and the vertical axis represents a delay time of the semiconductor circuit 110 of FIG. 1. Here, the delay time may be a propagation delay time that is generated when a signal is propagated into the semiconductor circuit 110. The delay time of the semiconductor circuit 110 is related to the operation speed of the semiconductor circuit 110. FIG. 2 shows the delay time of the semiconductor circuit 110 according to the temperature when the drive voltage of the semiconductor circuit 110 is a first voltage V1, a second voltage V2, or a third voltage V3. The first voltage V1 has a voltage level higher than the second voltage V2 and the second voltage V2 has a voltage level higher than the third voltage V3.

The first to third voltages V1 to V3 may be a low voltage level such as NTV or STV described above. In this case, as the temperature increases, a TEI occurs in which the delay time of the semiconductor circuit 110 decreases. As the drive voltage level is lower, the decrease amount in the delay time due to the temperature rise may be increased. The delay time of a semiconductor circuit driven at a voltage level exceeding the conventional low voltage increases with an increase in temperature. That is, since the driving speed of the semiconductor circuit is reduced as the temperature rises due to heat generation or the like, strict temperature control of the semiconductor device 100 is required for securing the driving speed. On the other hand, the semiconductor circuit 110 having the characteristics of TEI as shown in FIG. 2 has a limitation for securing the driving speed because the driving speed of the semiconductor circuit 110 increases as the temperature rises. Thus, the low power operation and the high speed operation of the semiconductor device 100 may be ensured.

Figure 3:
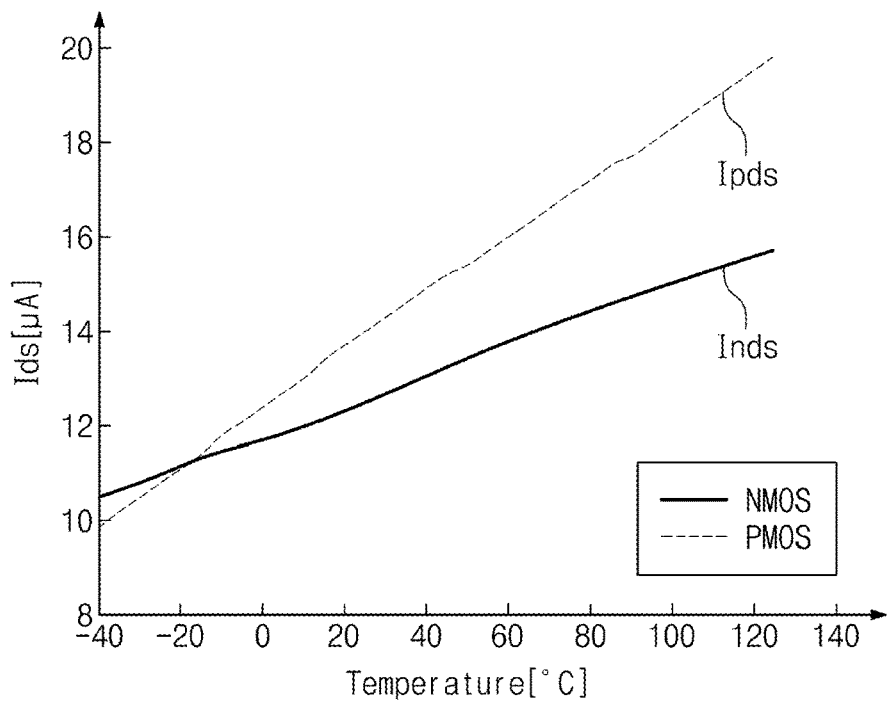
FIG. 3 is a graph showing the magnitude of the PMOS source-drain current and the NMOS source-drain current according to the temperature change in the semiconductor circuit of FIG. 1.

FIG. 3 is a graph showing the magnitude of the PMOS source-drain current and the NMOS source-drain current according to the temperature change in the semiconductor circuit of FIG. 1. Referring to FIG. 3, the horizontal axis represents a temperature of the semiconductor circuit 110 of FIG. 1, and the vertical axis represents a magnitude of current. It is assumed that the channel width of the PMOS transistor is about 720 nm and the channel width of the NMOS transistor is about 270 nm. It is assumed that a clock signal having a peak value of 0.5 V is applied to the gate terminal of the PMOS transistor and the gate terminal of the NMOS transistor.

The PMOS source-drain current Ipds and the NMOS source-drain current Inds increase as the temperature increases. Here, the PMOS source-drain current Ipds may mean the source-drain current when the channel is formed in the PMOS transistor, for example, when the clock signal is 0V. In addition, the NMOS source-drain current Inds may mean the source-drain current when the channel is formed in the NMOS transistor, for example, when the clock signal is 0.5V. The increase amount of the PMOS source-drain current Ipds with the increase of the temperature may be larger than the increase amount of the NMOS source-drain current Inds. As the temperature of the CMOS circuit increases, the difference between the PMOS source-drain current Ipds and the NMOS source-drain current Inds increases. That is, as the temperature of the CMOS circuit increases, a significant difference in characteristics occurs between the PMOS transistor and the NMOS transistor, resulting in a malfunction of the semiconductor circuit 110.

Figure 4:
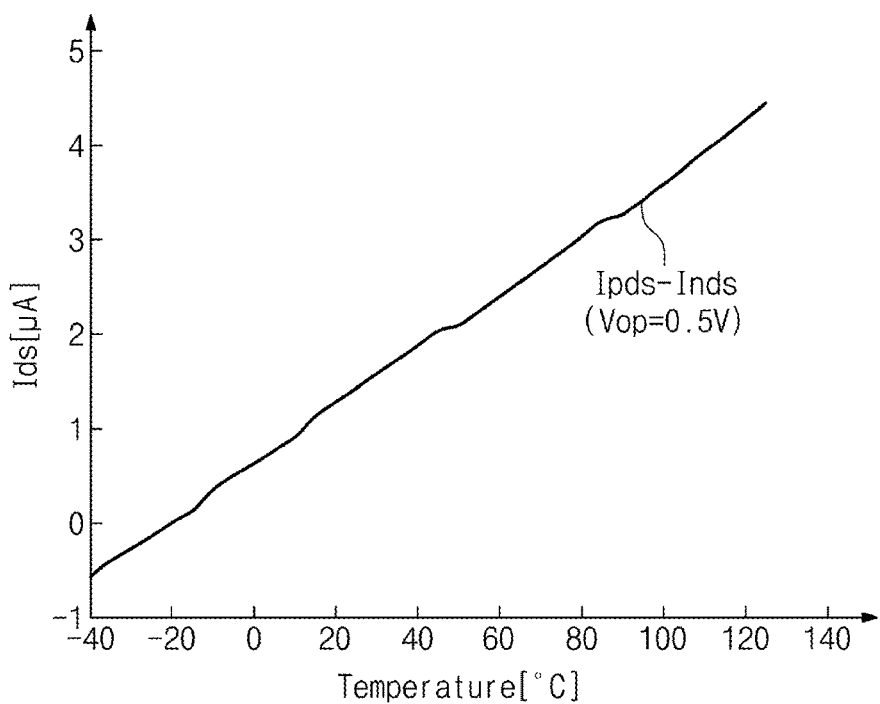
FIG. 4 is a graph showing the difference between the PMOS source-drain current and the NMOS source-drain current according to the temperature change in the semiconductor circuit of FIG. 1.

FIG. 4 is a graph showing the difference between the PMOS source-drain current and the NMOS source-drain current according to the temperature change in the semiconductor circuit of FIG. 1. Referring to FIG. 4, the horizontal axis represents a temperature of the semiconductor circuit 110 of FIG. 1, and the vertical axis represents a magnitude of current. It is assumed that the channel width of the PMOS transistor is about 720 nm and the channel width of the NMOS transistor is about 270 nm. It is assumed that a clock signal having a peak value of 0.5 V is applied to the gate terminal of the PMOS transistor and the gate terminal of the NMOS transistor. That is, the gate voltage applied to the CMOS circuit may be a clock signal that repeats 0 V and 0.5 V depending on the clock frequency.

The difference (Ipds−Inds) between the PMOS source-drain current and the NMOS source-drain current increases with increasing temperature. As shown in FIG. 3, the PMOS source-drain current Ipds is the source-drain current when the channel is formed in the PMOS transistor, and the NMOS source-drain current Inds is the source-drain current when the channel is formed in the NMOS transistor. The difference value (Ipds−Inds) between the PMOS source-drain current and the NMOS source-drain current may be an indicator for determining an operating speed, a driving a capacitive load, and the like, which are determined by a characteristic difference according each structure of the PMOS transistor and the NMOS transistor.

Since the difference value (Ipds−Inds) increases as the temperature of the CMOS circuit increases, the timing at which the channel of the PMOS transistor is formed and disappears and the timing at which the channel of the NMOS transistor is formed and disappears may be different from each other. For example, when the clock signal is 0 V, a channel should be formed in the PMOS transistor, and the channel should disappear in the NMOS transistor. However, as the temperature increases, channel formation and disappearance may not occur at the same time. In this case, the signal outputted from the CMOS circuit may be different from the expected signal, and a malfunction may occur in the semiconductor circuit 110.

Figure 5:
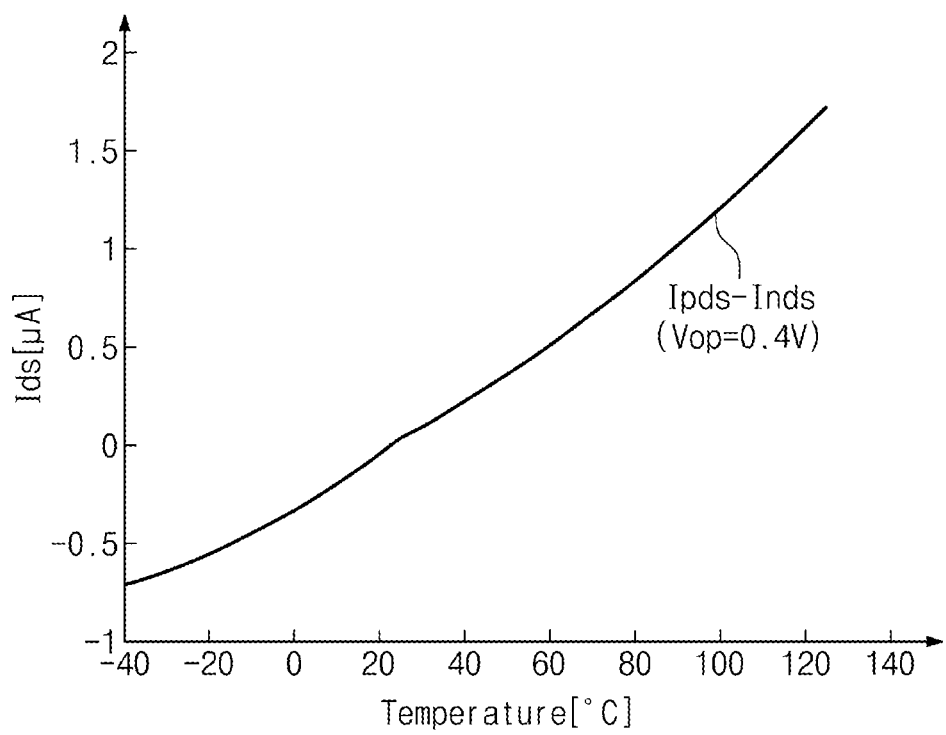
FIG. 5 is a graph showing the difference between the PMOS source-drain current and the NMOS source-drain current according to the temperature change in the semiconductor circuit of FIG. 1.

FIG. 5 is a graph showing the difference between the PMOS source-drain current and the NMOS source-drain current according to the temperature change in the semiconductor circuit of FIG. 1. Referring to FIG. 5, the horizontal axis represents a temperature of the semiconductor circuit 110 of FIG. 1, and the vertical axis represents a magnitude of current. It is assumed that the channel width of the PMOS transistor is about 720 nm and the channel width of the NMOS transistor is about 270 nm. It is assumed that a clock signal having a peak value of 0.4V is applied to the gate terminal of the PMOS transistor and the gate terminal of the NMOS transistor. That is, the gate voltage applied to the CMOS circuit may be a clock signal that repeats 0 V and 0.4V depending on the clock frequency.

The difference (Ipds−Inds) between the PMOS source-drain current and the NMOS source-drain current increases with increasing temperature. Compared with FIG. 4, the magnitude of the gate voltage applied to the CMOS circuit is reduced by 0.1 V. In this case, as the temperature increases, the difference (Ipds−Inds) may appear to increase exponentially. Therefore, when the drive voltage of the semiconductor circuit 110 is lowered for low-power driving, the difference in characteristics between the PMOS transistor and the NMOS transistor may be larger as the temperature increases and the possibility of malfunction may increase.

FIGS. 6A to 6D are graphs for explaining the occurrence of a malfunction due to a change in temperature in the semiconductor circuit of FIG. 1. FIGS. 6A to 6D show the operation change of the semiconductor circuit 110 according to the temperature change and the voltage level of the clock signal for operating the semiconductor circuit 110. In FIGS.

6A to 6D, the horizontal axis represents a time, and the vertical axis represents voltage levels of input data, a clock signal, and output data. It is assumed that the semiconductor circuit 110 includes a D-flip flop including a CMOS circuit. During normal operation of the D-flip-flop, the output data appears to have a waveform of input data delayed by a predetermined time.

Figure 6A:
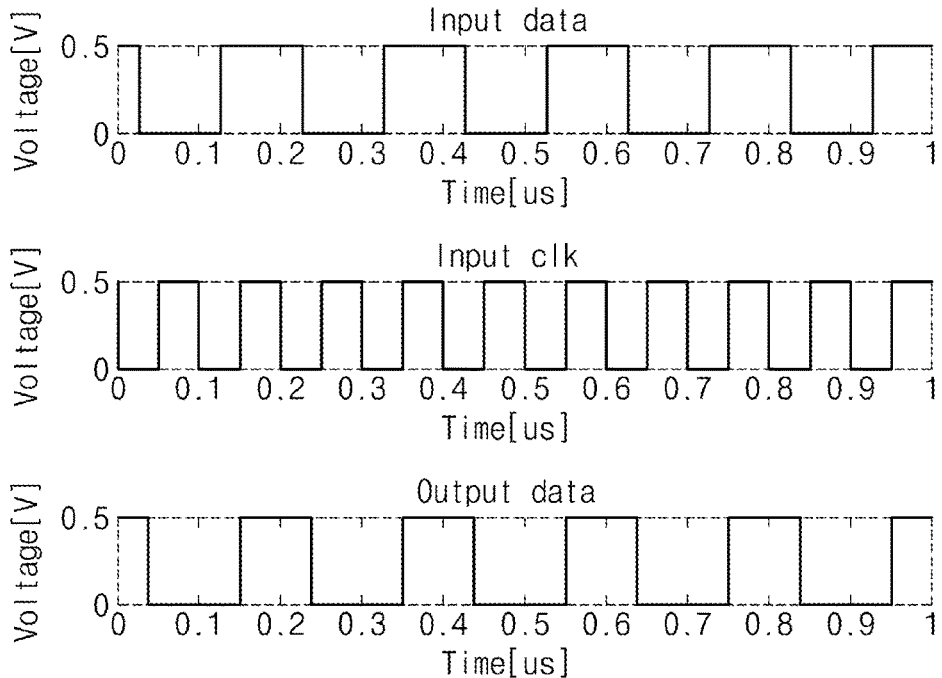
FIGS. 6A to 6D are graphs for explaining the occurrence of a malfunction due to a change in temperature in the semiconductor circuit of FIG. 1.

FIG. 6A is a graph for explaining input/output data of a semiconductor circuit operating based on a clock signal having a peak value of 0.5 V at a temperature of 40° C. At a temperature of 40° C., the D-flip flop included in the semiconductor circuit 110 appears to operate normally. That is, the CMOS circuit included in the D-flip flop operates normally. The D-flip-flop may output 0.5V or 0V, which is the voltage level of the input data, as the output data at the rising edge of the clock signal.

Figure 6B:
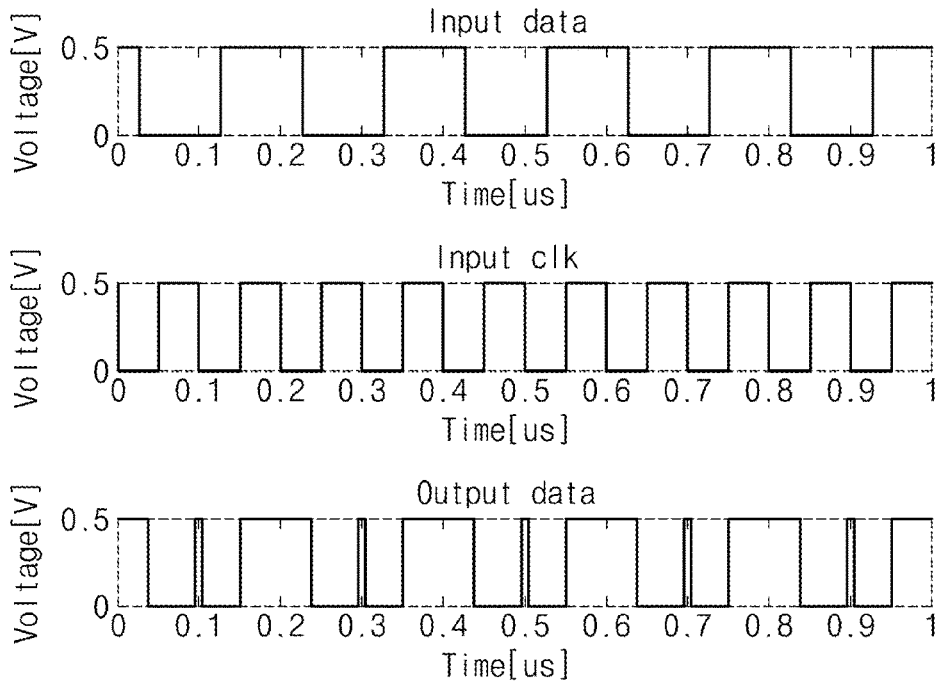

FIG. 6B is a graph for explaining input/output data of a semiconductor circuit operating based on a clock signal having a peak value of 0.5 V at a temperature of 45° C. The D-flip-flop shown in FIG. 6A and the D-flip-flop shown in FIG. 6B are the same, and the input data and the clock signal shown in FIG. 6B and the input data and the clock signal shown in FIG. 6A are the same. However, the temperature of the semiconductor circuit 110 rises from 40° C. to 45° C. In this case, a malfunction may occur in the CMOS circuit included in the D-flip-flop. The D-flip-flop may output 0.5 V different from 0 V, which is the voltage level of the input data, as the output data at the falling edge of the clock signal.

Specifically, as the temperature increases, the characteristic difference between the PMOS transistor and the NMOS transistor included in the CMOS circuit may become larger. As a result, the PMOS transistor and the NMOS transistor may not operate complementarily at the falling edge of the clock signal. That is, the channels of the PMOS transistor and the NMOS transistor may be formed simultaneously or may disappear simultaneously. Based on this malfunction, the output data may appear different from the input data.

Figure 6C:
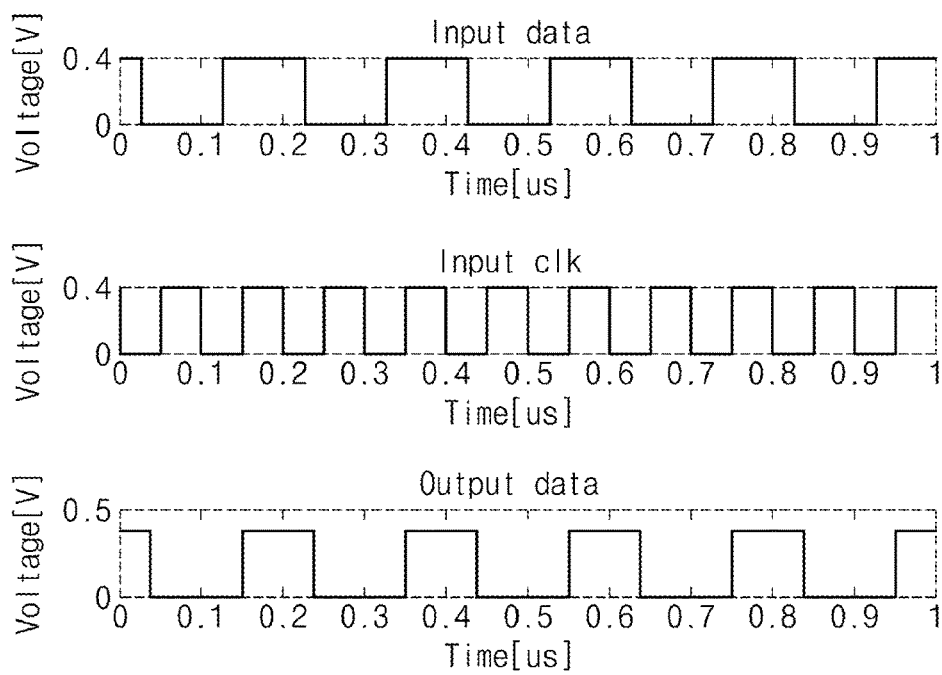

FIG. 6C is a graph for explaining input/output data of a semiconductor circuit operating based on a clock signal having a peak value of 0.4V at a temperature of 30° C. At a temperature of 30° C., the CMOS circuit included in the semiconductor circuit 110 operates normally. The D-flip-flop may output 0.4V or 0V, which is the voltage level of the input data, as the output data at the rising edge of the clock signal.

Figure 6D:
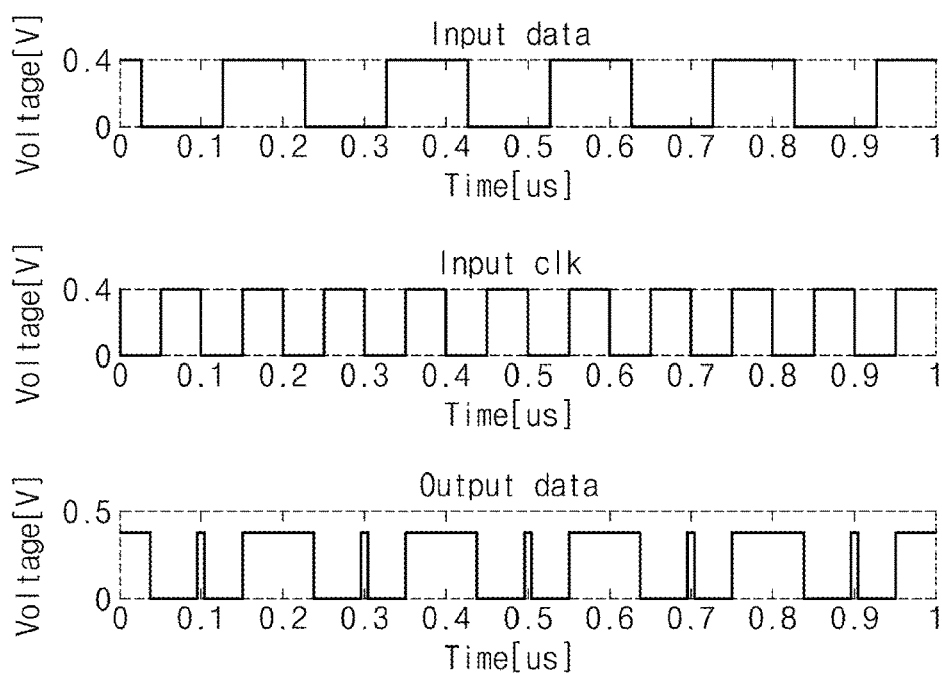

FIG. 6D is a graph for explaining input/output data of a semiconductor circuit operating based on a clock signal having a peak value of 0.4V at a temperature of 35° C. The D-flip-flop shown in FIG. 6D and the D-flip-flop shown in FIG. 6C are the same, and the input data and the clock signal shown in FIG. 6D and the input data and the clock signal shown in FIG. 6C are the same. However, the temperature of the semiconductor circuit 110 rises from 30° C. to 35° C. In this case, a malfunction may occur in the CMOS circuit included in the D-flip-flop. The D-flip-flop may output 0.4V different from 0 V, which is the voltage level of the input data, as the output data at the falling edge of the clock signal.

As compared with FIG. 6B, as the voltage level at which the semiconductor circuit 110 operates becomes lower, the temperature at which the malfunction occurs may be lowered. This is because as described with reference to FIGS. 4 and 5, as the semiconductor circuit 110 operates at a low voltage, the difference (Ipds−Inds) between the PMOS source-drain current and the NMOS source-drain current depending on the temperature exponentially increases. That is, as the semiconductor circuit 110 operates at a low voltage, the characteristic difference between the PMOS transistor and the NMOS transistor becomes larger, and the malfunction due to this may be caused more frequently.

Figure 7:
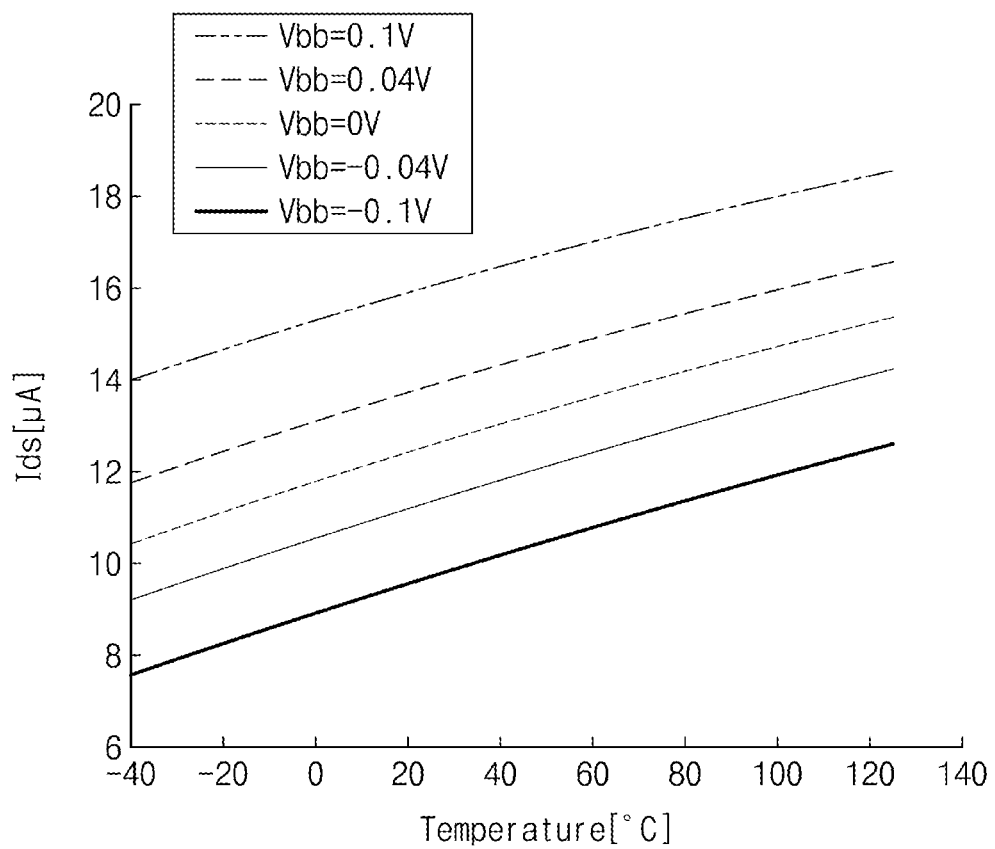
FIG. 7 is a graph showing the magnitude of the NMOS source-drain current according to the body-bias voltage level applied to the NMOS transistor of the semiconductor circuit of FIG. 1.

FIG. 7 is a graph showing the magnitude of the NMOS source-drain current according to the body-bias voltage level applied to the NMOS transistor of the semiconductor circuit of FIG. 1. Referring to FIG. 7, the horizontal axis represents a temperature of the semiconductor circuit 110 of FIG. 1, and the vertical axis represents a magnitude of current. It is assumed that the channel width of the NMOS transistor is 270 nm and a gate voltage of 0.5 V is applied to the gate terminal of the NMOS transistor. FIG. 7 shows the magnitude of the NMOS source-drain current when the body-bias voltage applied to the NMOS transistor is −0.1V, −0.04V, 0V, 0.04V, and 0.1V. For convenience of explanation, referring to the reference numerals of FIG. 1, FIG. 7 will be described.

As described above with reference to FIG. 3, as the temperature increases, the magnitude of the NMOS source-drain current increases. However, the magnitude of the NMOS source-drain current may vary depending on the body-bias voltage level applied to the body of the NMOS transistor. Also, although not shown in the drawing, the magnitude of the PMOS source-drain current may vary depending on the body-bias voltage level applied to the body of the PMOS transistor. However, when the same body-bias voltage is applied to the NMOS transistor and the PMOS transistor, wince the characteristics of the NMOS transistor and the PMOS transistor are different from each other, the change amount of the NMOS source-drain current and the change amount of the PMOS source-drain current may be different.

As the body-bias voltage level increases, the magnitude of the NMOS source-drain current increases. As the temperature increases, since the increase amount of the PMOS source-drain current is greater than the increase amount of the NMOS source-drain current, the need to increase the magnitude of the NMOS source-drain current is required. Accordingly, when the temperature increases, the controller 120 may refer to the characteristic table and the malfunction reference table to control the body-bias generator 135 so that the body-bias voltage level applied to the NMOS transistor is increased. Alternatively, in order to reduce the magnitude of the PMOS source-drain current when the temperature increases, the controller 120 may control the body-bias generator 135 so that the body-bias voltage level applied to the PMOS transistor is increased.

Figure 8:
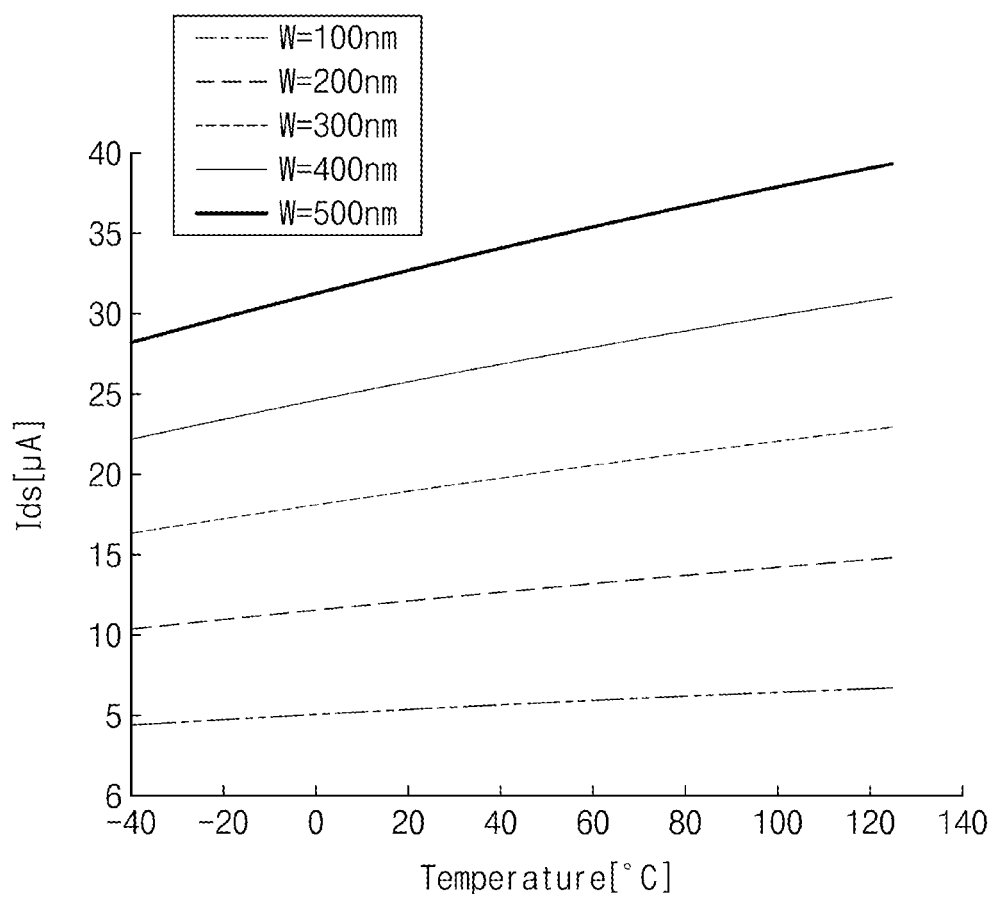
FIG. 8 is a graph showing the magnitude of the NMOS source-drain current according to the channel width of the NMOS transistor of the semiconductor circuit of FIG. 1.

FIG. 8 is a graph showing the magnitude of the NMOS source-drain current according to the channel width of the NMOS transistor of the semiconductor circuit of FIG. 1. Referring to FIG. 8, the horizontal axis represents a temperature of the semiconductor circuit 110 of FIG. 1, and the vertical axis represents a magnitude of current. It is assumed that a gate voltage of 0.5 V is applied to the gate terminal of the NMOS transistor. FIG. 8 shows the magnitude of the NMOS source-drain current when the channel width of the NMOS transistor is 100 nm, 200 nm, 300 nm, 400 nm, and 500 nm. For convenience of explanation, referring to the reference numerals of FIG. 1, FIG. 8 will be described.

As the channel width of the NMOS transistor increases, the magnitude of the NMOS source-drain current increases. As the temperature increases, since the increase amount of the PMOS source-drain current is greater than the increase amount of the NMOS source-drain current, the need to increase the magnitude of the NMOS source-drain current is required. The increase amount of the NMOS source-drain current is larger when the channel width is increased than when the body-bias voltage level is increased. Therefore, in the case where it is difficult to lower the characteristic difference between the PMOS transistor and the NMOS transistor by the body-bias voltage, the spare circuit 115 may be used. Alternatively, even if the required body-bias voltage level is higher than the reference bias to cause high power consumption so that it does not have the advantage of low power driving, the spare circuit 115 may be used.

In order to change the channel width of the NMOS transistor or the PMOS transistor according to the temperature change, the spare circuit 115 may include a MOS transistor (an NMOS transistor or a PMOS transistor) having a channel width different from that of the PMOS transistor or the NMOS transistor. For example, the spare circuit 115 may include a MOS transistor having a channel width greater than that of the NMOS transistor, and the controller 120 may control the semiconductor circuit 110 to replace the NMOS transistor with the spare circuit 115. Alternatively, the spare circuit 115 may include a MOS transistor having a channel width less than that of the PMOS transistor, and the controller 120 may control the semiconductor circuit 110 to replace the PMOS transistor with the spare circuit 115.

Figure 9:
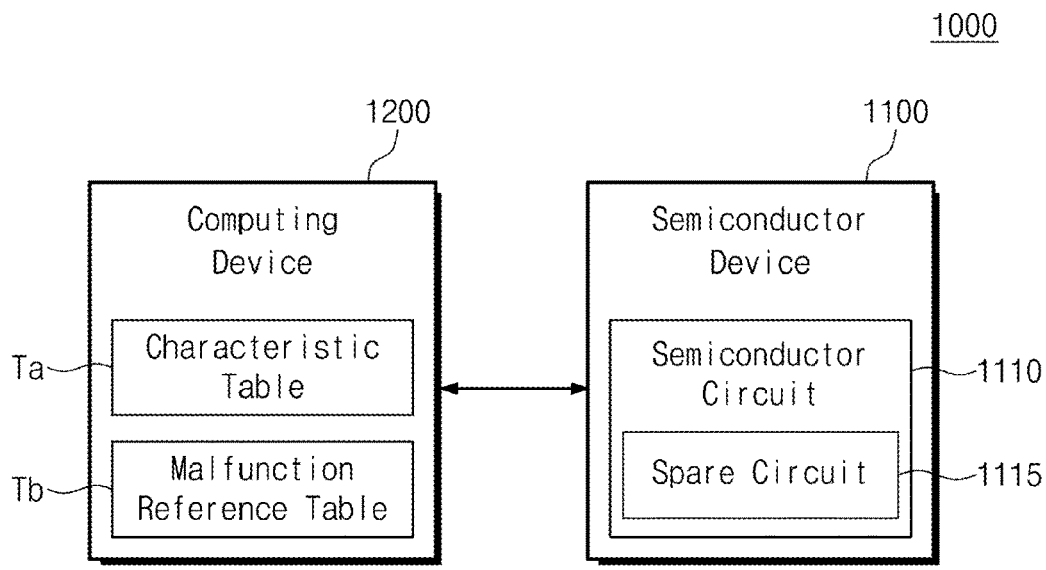
FIG. 9 is a block diagram of a semiconductor control system according to an embodiment of the inventive concept.

FIG. 9 is a block diagram of a semiconductor control system according to an embodiment of the inventive concept. Referring to FIG. 9, a semiconductor control system 1000 may include a semiconductor device 1100 and a computing device 1200. The semiconductor device 1100 may include a semiconductor circuit 1110. The semiconductor circuit 1110 may include a CMOS circuit and may be substantially the same as the semiconductor circuit 110 of FIG. 1. The semiconductor circuit 1110 may further include a spare circuit 1115 and the spare circuit 1115 may be substantially the same as the spare circuit 115 of FIG. 1.

The computing device 1200 may be configured to generate information for controlling the semiconductor device 1100. The computing device 1200 senses the characteristic difference between the PMOS transistor and the NMOS transistor generated according to the temperature change of the semiconductor circuit 1110 and generates information for controlling the semiconductor device 1100 based on the sensed characteristic difference. Although not specifically shown in the drawing, in order to sense the characteristic difference, the computing device 1200 may include a temperature sensor for measuring the temperature of the semiconductor circuit 1110, an ammeter for measuring PMOS source-drain current and NMOS source-drain current, and a voltmeter for measuring the drive voltage of the semiconductor circuit, the gate voltage applied to the CMOS circuit, or the body-bias voltage.

The computing device 1200 may be configured to generate information for determining a malfunction of a CMOS circuit included in the semiconductor circuit 1110. For this, the computing device 1200 may provide a low voltage, such as NTV or STV, to the semiconductor circuit 1110 as a drive voltage, and may provide a CMOS circuit with a gate voltage that is arbitrarily generated to receive the characteristic information of the semiconductor circuit 1110. The gate voltage may be inputted to the gate terminals of the PMOS transistor and the NMOS transistor. The gate voltage may be a clock signal having a clock frequency. That is, in order to measure the PMOS source-drain current and the NMOS source-drain current according to the temperature, the computing device 1200 may provide various voltages to the semiconductor device 1100.

The computing device 1200 may generate the characteristic table Ta based on the measured PMOS source-drain current and NMOS source-drain current. The information contained in the characteristic table Ta may be managed in the form of a table in the computing device 1200, but is not limited thereto. The computing device 1200 records information on the PMOS source-drain current, the NMOS source-drain current, or the difference value thereof measured according to the change of the operating condition from the semiconductor circuit 1110 in the form of a table, so that it may generate the characteristic table Ta. As described above, the characteristic table includes information on the characteristics of the PMOS transistor and the NMOS transistor according to the change of the operating condition.

The computing device 1200 may generate a malfunction criterion table Tb based on the measured PMOS source-drain current and NMOS source-drain current. The information included in the malfunction reference table Tb may be managed in the form of a table in the computing device 1200, but is not limited thereto. The computing device 1200 records information on a threshold value at which deterioration or malfunction occurs depending on the type of the semiconductor circuit 1110 in a table form, so that it may generate the malfunction reference table Tb. For example, the computing device 1200 records threshold values for various logic circuits such as inverters, flip-flops, NOR, NAND, and XNOR gate circuits, so that it may generate the malfunction reference table Tb. As described above, the threshold value may be defined as the maximum value of the difference between the PMOS source-drain current and the NMOS source-drain current, which determines that the CMOS circuit operates normally.

The characteristic table Ta and the malfunction reference table Tb may be referred to in order to determine malfunction of the semiconductor circuit 1110. Illustratively, the characteristic table Ta and the malfunction reference table Tb may be transmitted to the semiconductor device 1100 so as to be stored in a memory (not shown) of the semiconductor device 1100. Alternatively, information required for controlling the body-bias voltage of the semiconductor device 1100 or for determining malfunction may be selected from the information included in the characteristic table Ta and the malfunction reference table Tb and may be delivered to the semiconductor device 1100.

Figure 10:
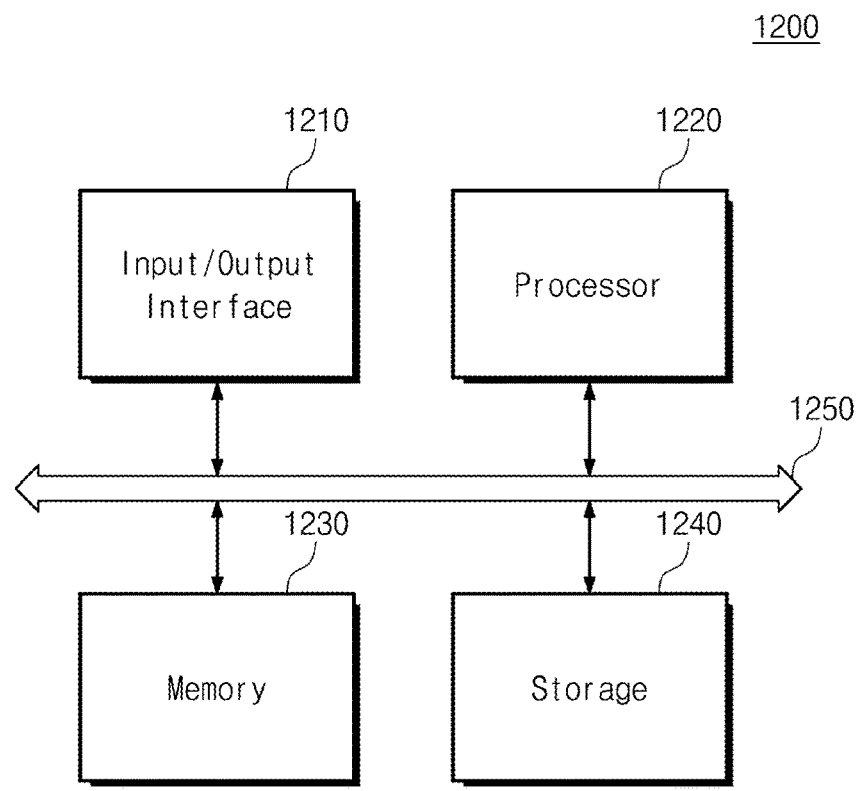
FIG. 10 is an exemplary block diagram of the circuit designing device of FIG. 9.

FIG. 10 is an exemplary block diagram of the computing device of FIG. 9. The block diagram of FIG. 10 will be understood as an exemplary configuration for determining the body-bias voltage level applied to the semiconductor circuit 1110, and for collecting and generating information for determining criteria using the spare circuit 1115, and the structure of the computing device 1200 will not be limited thereto. Referring to FIG. 10, the computing device 1200 may include an input/output interface 1210, a processor 1220, a memory 1230, a storage 1240, and a bus 1250. For example, and not limitation, the computing device 1200 may be implemented with a computing device that processes, generates, and records information, but is not limited thereto. For convenience of explanation, referring to the reference numerals of FIG. 9, FIG. 10 will be described.

The input/output interface 1210 is configured to receive information on the temperature, the source-drain current, the drive voltage, the gate voltage applied to the CMOS circuit, or the body-bias voltage from the semiconductor device 1100. The input/output interface 1210 may provide information received from the semiconductor device 1100 to the processor 1220, the memory 1230, or the storage 1240 through the bus 1250. Further, the input/output interface 1210 may be configured to provide the characteristic table Ta or the malfunction reference table Tb generated based on the received information to the semiconductor device 1100.

The processor 1220 may function as a central processing unit of the computing device 1200. The processor 1220 may perform the control operation and the calculation operation required for generation of the characteristic table Ta and the malfunction reference table Tb. For example, under the control of the processor 1220, the input/output interface 1210 may provide a drive voltage, a clock signal, or a body-bias voltage to the semiconductor circuit 1110, and may receive various information related to the characteristics of the semiconductor circuit 1110. According to the control of the processor, the received information is recorded in a table form and may be managed as the characteristic table Ta and the malfunction reference table Tb. The processor 1220 may operate utilizing the computation space of the memory 1230 and may read files and executable files of the application for running the operating system from the storage 1240. The processor 1220 may execute the operating system and various applications.

The memory 1230 may store data and process codes processed or to be processed by the processor 1220. For example, the memory 1230 may store various information related to the characteristics of the semiconductor circuit 1110 provided from the input/output interface 1210 and the characteristic table Ta and the malfunction reference table Tb, which are generated from the result thereof. The memory 1230 may be used as the main memory of the computing device 1200.

The storage 1240 may store data generated by the operating system or applications for the purpose of long-term storage, a file for running the operating system, or executable files of applications. For example, the storage 1240 may collect various information related to the characteristics of the semiconductor circuit 1110 and store files for execution of applications to generate a characteristic table Ta and a malfunctioning criteria table Tb. The storage 1240 may be used as an auxiliary storage device of the computing device 1200.

The bus 1250 may provide a communication path between the components of the computing device 1200. The input/output interface 1210, the processor 1220, the memory 1230, and the storage 1240 may exchange data with one another through the bus 1250. The bus 1250 may be configured to support various types of communication formats used in the computing device 1200.

Figure 11:
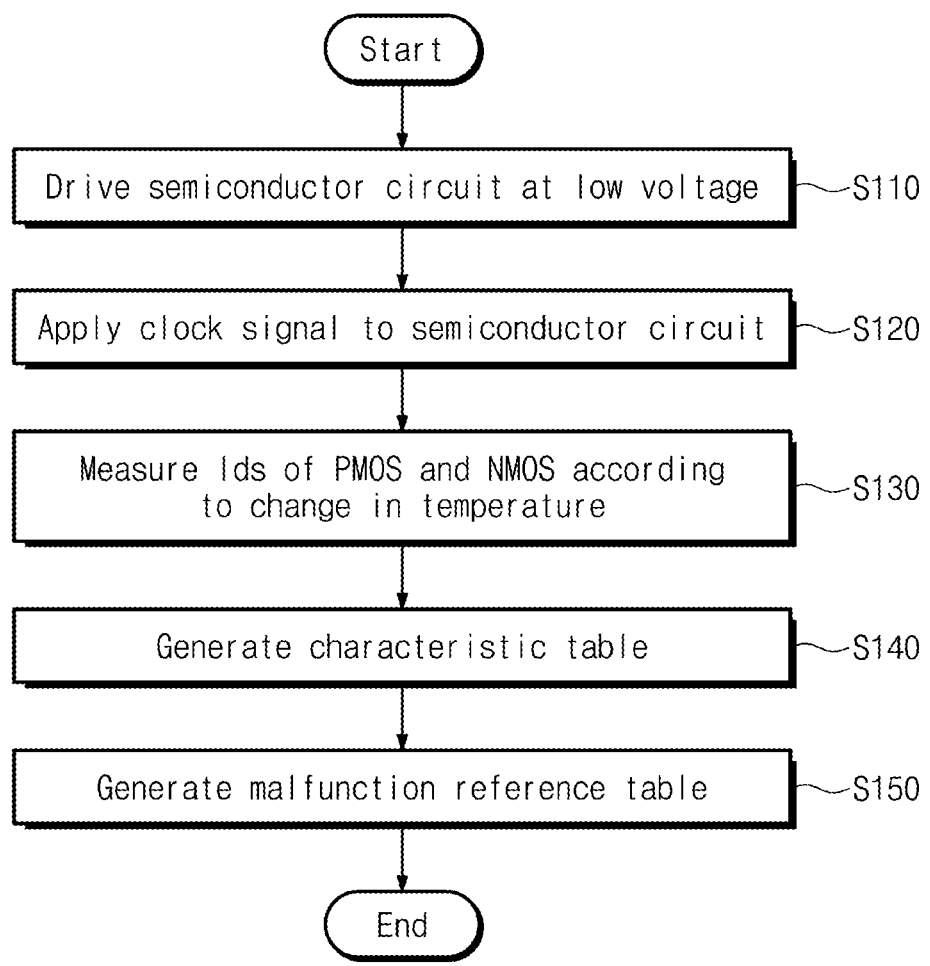
FIG. 11 is a flowchart of a method of controlling a semiconductor device using the semiconductor control system of FIG. 9.

FIG. 11 is a flowchart of a method of controlling a semiconductor device using the semiconductor control system of FIG. 9. Specifically, FIG. 11 is a flowchart of a method for generating characteristic information for controlling the semiconductor device 1100 using the semiconductor control system 1000 or information for determining malfunction of the CMOS circuit included in the semiconductor circuit. For convenience of explanation, referring to the reference numerals of FIG. 9, FIG. 11 will be described.

In operation S110, the semiconductor device 1100 is driven at a low voltage satisfying the TEI. For example, the semiconductor device 1100 may be driven with a low voltage such as NTV or STV. For this, a voltage generator (not shown) included in the computing device 1200 or the semiconductor device 1100 may provide a low voltage to the semiconductor circuit 1110 as a drive voltage.

In operation S120, a clock signal is applied to the semiconductor circuit 1110. Specifically, a clock signal may be applied to the gate terminals of the PMOS transistor and the NMOS transistor constituting the CMOS circuit included in the semiconductor circuit 1110. The clock signal may be repeated high and low depending on the clock frequency. Here, the high level may be a voltage level that forms a channel in the NMOS transistor and destroys the channel in the PMOS transistor. For example, the high level may be equal to the drive voltage level, but is not limited thereto. The low level may be a voltage level that forms a channel in the PMOS transistor and destroys the channel in the NMOS transistor. For example, the low level may be 0 V, but is not limited thereto.

In operation S130, the computing device 1200 may measure the PMOS source-drain current and the NMOS source-drain current as the temperature changes. For example, the PMOS source-drain current may be the current when a low level clock signal is applied to the gate terminal of the PMOS transistor, and the NMOS source-drain current may be the current when a high level clock signal is applied to the gate terminal of the NMOS transistor. The computing device 1200 may measure the amount of change in the PMOS source-drain current, the amount of change in the NMOS source-drain current as the temperature changes, and may measure the amount of change in the difference between the PMOS source-drain current and the NMOS source-drain current.

In operation S140, the computing device 1200 may generate a characteristic table Ta. The characteristic table Ta may be generated by recording information on the measured PMOS source-drain current or NMOS source-drain current, or a difference value thereof in the form of a table. The characteristic table Ta may include information on the magnitude of the PMOS source-drain current and the NMOS source-drain current according to the operating conditions of the semiconductor circuit 1110.

In operation S150, the computing device 1200 may generate a malfunction reference table Tb. The malfunction reference table Tb may be generated by recording information on a threshold value at which a deterioration or malfunction occurs depending on the type of the semiconductor circuit 1110, in the form of a table. The malfunction reference table Tb may include threshold value information according to the type of the semiconductor circuit of the semiconductor circuit 1110.

Figure 12:
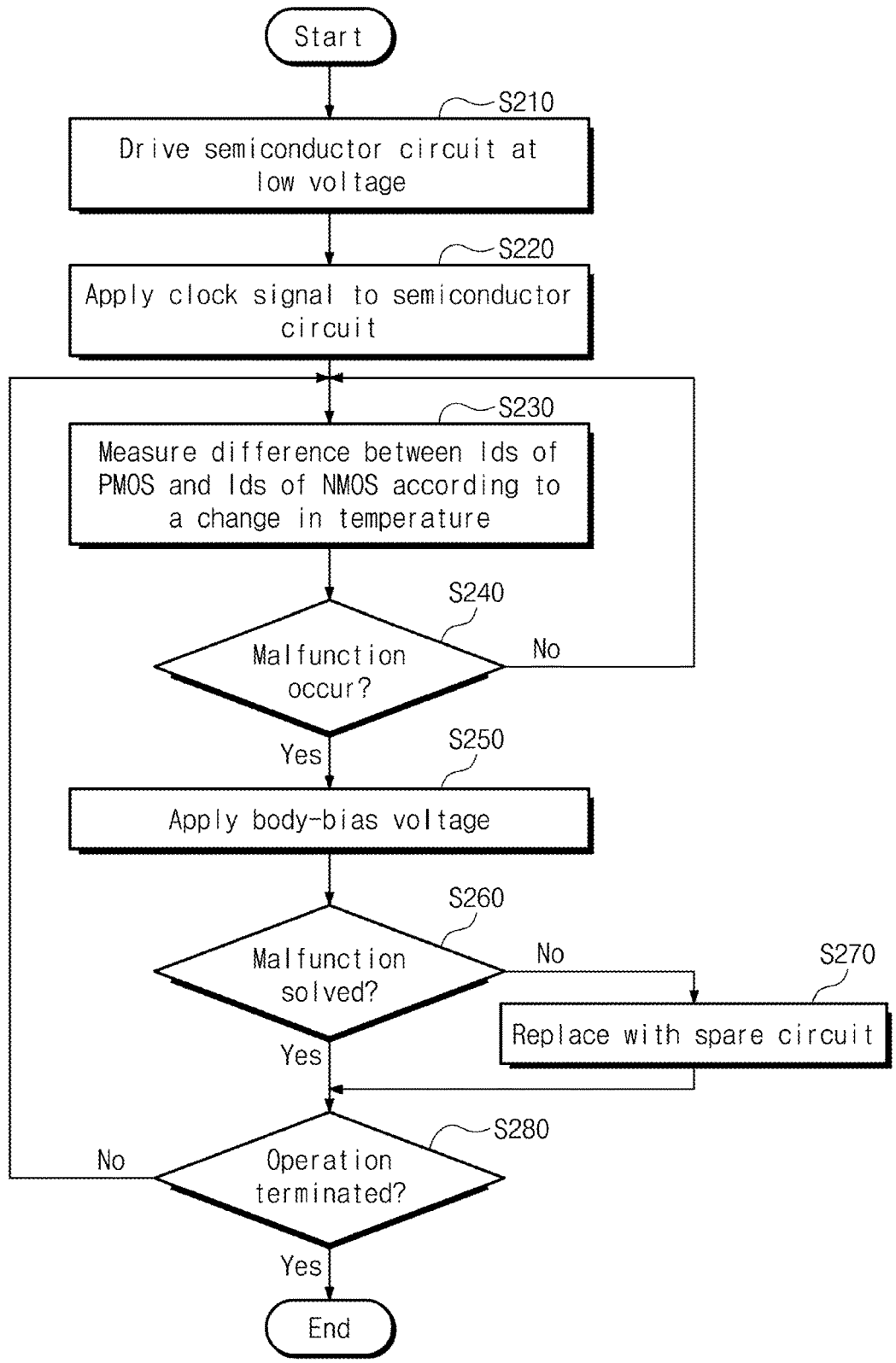
FIG. 12 is a flowchart of an operation method of the semiconductor device of FIG. 1 or the semiconductor device of FIG. 9.

FIG. 12 is a flowchart of an operation method of the semiconductor device of FIG. 1 or the semiconductor device of FIG. 9. The operation method of the semiconductor device may be performed with reference to the characteristic table Ta and the malfunction reference table Tb generated by the method of FIG. 11. For convenience of explanation, referring to the reference numerals of FIG. 1, FIG. 12 will be described.

In operation S210, the semiconductor device 100 is driven at a low voltage satisfying the TEI. For example, the semiconductor device 100 may be driven at a low voltage such as NTV or STV, and the voltage generator 130 may provide a low voltage to the semiconductor circuit 110 as a drive voltage.

In operation S220, a clock signal is applied to the semiconductor circuit 110. Specifically, a clock signal (gate voltage) may be applied to the gate terminals of the PMOS transistor and the NMOS transistor constituting the CMOS circuit included in the semiconductor circuit 110. The clock signal may be repeated high and low depending on the clock frequency.

In operation S230, the controller 120 may measure the difference between the PMOS source-drain current and the NMOS source-drain current with a change in temperature. For example, the PMOS source-drain current may be the current when a low level clock signal is applied to the gate terminal of the PMOS transistor, and the NMOS source-drain current may be the current when a high level clock signal is applied to the gate terminal of the NMOS transistor. In addition, the controller 120 may receive information on the temperature of the semiconductor circuit 110, information on the clock signal, information on the drive voltage, and information on the channel widths of the PMOS transistor and the NMOS transistor. Such information may be used by the controller 120 to determine malfunction of the CMOS circuit.

In operation S240, the controller 120 may determine a malfunction of the CMOS circuit based on the difference value between the PMOS source-drain current and the NMOS source-drain current. The controller 120 may determine malfunction of the CMOS circuit by referring to the characteristic table Ta and the malfunction reference table Tb generated in operation S140 and operation S150 in FIG. 11. The controller 120 may refer to the malfunction reference table Tb and extract the threshold value information corresponding to the logic circuit included in the CMOS circuit. The controller 120 may compare the difference value between the PMOS source-drain current and the NMOS source-drain current to the extracted threshold value. As a result of comparison, if the difference value is less than or equal to (or less than) the extracted threshold value, it is determined that no malfunction occurs, and operation S230 is repeated.

As a result of comparison, if the difference value is greater than (or equal to or greater than) the extracted threshold value, it is determined that malfunction occurs. In this case, the controller 120 may refer to the characteristic table Ta to extract a body-bias level for lowering the difference value to a value below the threshold value (or a value smaller than the threshold value). In operation S230, this body-bias level may be extracted by retrieving the body-bias level corresponding to the additionally received information on the operating conditions of the semiconductor circuit. The controller 120 may generate a body-bias control signal for adjusting the body-bias voltage to an extracted body-bias level, and may provide a body-bias control signal to the body-bias generator 135. Thereafter, operation S250 is performed.

In operation S250, the body-bias generator 135 applies a body-bias voltage to the PMOS transistor or the NMOS transistor. The body-bias generator 135 may adjust the body-bias voltage provided to the CMOS circuit based on the body-bias control signal provided from the controller 120.

In operation S260, the controller 120 again determines a malfunction of the CMOS circuit to which the body-bias voltage is applied. The process of determining the malfunction is substantially the same as operation S240. If it is determined that the malfunction of the CMOS circuit is not solved, operation S270 is performed. If it is determined that the malfunction is not solved, the characteristic difference may be so large that it is difficult to overcome the characteristic difference between the PMOS transistor and the NMOS transistor, with the body-bias voltage. Alternatively, if it is determined that the malfunction is not solved, the required body-bias voltage requires a voltage level that is greater than the reference bias voltage. Thus, even if the characteristic difference between the PMOS transistor and the NMOS transistor is overcome, this may be the case where significant power consumption is expected. If it is determined that the malfunction of the CMOS circuit is solved, operation S280 is performed.

In operation S270, the controller 120 replaces the PMOS transistor or the NMOS transistor with the spare circuit 115. The spare circuit 115 may include a PMOS transistor or a MOS transistor having a channel width different from that of the NMOS transistor. By using the spare circuit 115, a malfunction that may not be overcome by the body-bias voltage may be overcome.

In operation S280, it is determined whether or not the operation of the semiconductor device 100 is completed. If the operation of the semiconductor device 100 continues, the process returns to operation S230. In this case, the controller 120 may continuously determine the malfunction of the CMOS circuit according to the change of the temperature.

A semiconductor device including a CMOS circuit and an operation method thereof according to an embodiment of the inventive concept may reduce a characteristic difference between a PMOS transistor and an NMOS transistor caused by a temperature change by using a body-bias voltage and may reduce malfunctions and performance deterioration of the semiconductor circuit due to the difference in characteristics.

Although the exemplary embodiments of the inventive concept have been described, it is understood that the inventive concept should not be limited to these exemplary embodiments but various changes and modifications may be made by one ordinary skilled in the art within the spirit and scope of the inventive concept as hereinafter claimed.

What is claimed is:

1. A semiconductor device comprising:
   a semiconductor circuit including a CMOS circuit including a PMOS transistor and an NMOS transistor, and configured to operate with a drive voltage to reduce a delay time between input and output as a temperature increases;
   a controller configured to determine a malfunction of the CMOS circuit based on a first difference between a first source-drain current of the PMOS transistor and a second source-drain current of the NMOS transistor according to a change in temperature; and
   a voltage generator configured to generate or adjust a body-bias voltage applied to the PMOS transistor or the NMOS transistor based on the determination of the controller.

2. The semiconductor device of claim 1, wherein the controller determines the malfunction by referring to a characteristic table and a malfunction reference table,
   wherein the characteristic table comprises information on a magnitude of the first source-drain current and a magnitude of the second source-drain current according to a change in operating conditions of the semiconductor circuit,
   wherein the malfunction reference table comprises information on a threshold value of the first difference to determine the malfunction.

3. The semiconductor device of claim 2, wherein the controller refers to the malfunction reference table to determine whether the first difference is greater than the threshold value, and if the first difference is greater than the threshold value, refers to the characteristic table to provide a body-bias control signal to the voltage generator.

4. The semiconductor device of claim 2, wherein the operating conditions comprise a temperature of the semiconductor circuit, a drive voltage of the semiconductor circuit, a magnitude of a clock signal applied to the CMOS circuit, or a channel width of the PMOS transistor or the NMOS transistor.

5. The semiconductor device of claim 1, wherein as the temperature increases, if the first difference is greater than the threshold value, the voltage generator increases a body-bias voltage applied to the NMOS transistor.

6. The semiconductor device of claim 1, wherein as the temperature increases, if the first difference is greater than the threshold value, the voltage generator increases a body-bias voltage applied to the PMOS transistor.

7. The semiconductor device of claim 1, wherein the semiconductor circuit further comprises a spare circuit including a MOS transistor having a channel width different from that of the PMOS transistor or the NMOS transistor,
wherein the controller further determines a malfunction of the CMOS circuit to which the body-bias voltage is applied, and replaces the PMOS transistor or the NMOS transistor with the spare circuit when it is determined that the CMOS circuit is malfunctioned.

8. The semiconductor device of claim 7, wherein the controller compares a threshold value with a second difference between a third source-drain current of the PMOS transistor and a fourth source-drain current of the NMOS transistor as the body-bias voltage is applied, and if the second difference is greater than the threshold value, replaces the PMOS transistor or the NMOS transistor with the spare circuit.

9. The semiconductor device of claim 1, wherein the semiconductor circuit further comprises a spare circuit including a MOS transistor having a channel width different from that of the PMOS transistor or the NMOS transistor,
wherein the controller replaces the PMOS transistor or the NMOS transistor with the spare circuit when the body-bias voltage is greater than a reference bias voltage.

10. An operation method of a semiconductor device including a CMOS circuit, the method comprising:
applying a gate voltage to the CMOS circuit operating at a drive voltage to reduce a delay time between input and output as a temperature increases;
measuring a difference between a first source-drain current flowing through a PMOS transistor of the CMOS circuit and a second source-drain current flowing through an NMOS transistor of the CMOS circuit according to a change in temperature;
determining a malfunction of the CMOS circuit based on the difference; and
applying a body-bias voltage to the PMOS transistor or the NMOS transistor when it is determined that the CMOS circuit is malfunctioned.

11. The method of claim 10, wherein the determining of the malfunction of the CMOS circuit comprises:
comparing the difference with a threshold value; and
generating a body-bias control signal for adjusting the body-bias voltage when the difference is greater than the threshold value.

12. The method of claim 11, wherein the comparing of the difference with the threshold value comprises:
extracting the threshold value by referring to a malfunction reference table including threshold value information according to a type of the semiconductor circuit; and
determining whether the difference is greater than the extracted threshold value.

13. The method of claim 11, wherein the generating of the body-bias control signal comprises extracting a body-bias voltage level for lowering the difference to the threshold value or less by referring to a characteristic table including information on a magnitude of a source-drain current flowing through the PMOS and a magnitude of a source-drain current flowing through the NMOS according to operating conditions of the semiconductor circuit.

14. The method of claim 10, further comprising:
determining again a malfunction of the CMOS circuit to which the body-bias voltage is applied;
replacing the PMOS transistor or the NMOS transistor with a spare circuit when it is determined that the CMOS circuit is malfunctioned,
wherein the spare circuit comprises a MOS transistor having a channel width different from that of the PMOS transistor or the NMOS transistor.

15. The method of claim 10, wherein the gate voltage is a clock signal in which a first voltage level and a second voltage level, which are different from each other according to a clock frequency, are repeated,
wherein the first source-drain current is a source-drain current flowing through the PMOS transistor when the first voltage level is applied to a gate terminal of the PMOS transistor,
wherein the second source-drain current is a source-drain current flowing through the NMOS transistor when the second voltage level is applied to a gate terminal of the NMOS transistor.

16. The method of claim 10, further comprising generating information for determining a malfunction of the CMOS circuit before applying the gate voltage to the CMOS circuit,
wherein the generating of the information for determining the malfunction of the CMOS circuit comprises:
generating a characteristic table including information on a magnitude of a source-drain current flowing through the PMOS and a magnitude of a source-drain current flowing through the NMOS according to an operating condition of the semiconductor circuit; and
generating a malfunction reference table including threshold value information according to a type of the semiconductor circuit.

* * * * *